US006687866B2

(12) United States Patent
Fukuda

(10) Patent No.: US 6,687,866 B2
(45) Date of Patent: Feb. 3, 2004

(54) LSI HAVING A BUILT-IN SELF-TEST CIRCUIT

(75) Inventor: Yasuhiro Fukuda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 422 days.

(21) Appl. No.: 09/741,010

(22) Filed: Dec. 21, 2000

(65) Prior Publication Data

US 2001/0054166 A1 Dec. 20, 2001

(30) Foreign Application Priority Data

Dec. 27, 1999 (JP) .......................................... 11-369001

(51) Int. Cl.$^7$ .............................................. G01R 31/28
(52) U.S. Cl. ...................................... 714/733; 375/376
(58) Field of Search ................................ 714/733, 724, 714/734; 375/376

(56) References Cited

U.S. PATENT DOCUMENTS

| 4,498,172 A | * | 2/1985 | Bhavsar ....................... 714/732 |
| 5,349,586 A | * | 9/1994 | Katsuta ........................ 714/724 |
| 5,475,694 A | * | 12/1995 | Ivanov et al. ................. 714/732 |
| 5,668,816 A | * | 9/1997 | Douskey et al. .............. 714/720 |
| 5,675,291 A | * | 10/1997 | Sudjian ......................... 331/17 |
| 5,818,772 A | * | 10/1998 | Kuge ............................ 365/201 |
| 5,822,228 A | * | 10/1998 | Irrinki et al. .................. 714/718 |
| 5,886,582 A | * | 3/1999 | Stansell ........................ 331/1 A |
| 5,889,435 A | | 3/1999 | Smith et al. |
| 5,946,246 A | * | 8/1999 | Jun et al. ..................... 365/201 |
| 5,991,888 A | * | 11/1999 | Faulkner et al. ............. 713/501 |
| 6,216,254 B1 | * | 4/2001 | Pesce et al. .................... 716/5 |
| 6,374,371 B1 | * | 4/2002 | Lee ............................... 714/42 |
| 6,396,889 B1 | * | 5/2002 | Sunter et al. ................ 375/376 |

FOREIGN PATENT DOCUMENTS

| JP | 6-6213 A | 1/1994 |
| JP | 7-18282 U | 3/1995 |
| JP | 7-218593 A | 8/1995 |
| JP | 10-90362 | 4/1998 |
| JP | 11-30646 | 2/1999 |
| JP | 11-264857 A | 9/1999 |

OTHER PUBLICATIONS

Weste et al., "Principles of CMOS VLSI Design", Addison–Wesley Publishing Co., 1993, pp. 334–335.*

* cited by examiner

Primary Examiner—Albert Decady
Assistant Examiner—Guy Lamarre
(74) Attorney, Agent, or Firm—Sughrue Mion, PLLC

(57) ABSTRACT

A LSI includes a logic circuit, a PLL circuit and a built-in self-test (BIST) circuit. When the PLL circuit detects a phase lock of the system clock signal of the LSI with a reference clock signal under the condition of presence of a test instruction signal, the PLL delivers a test enable signal to the BIST circuit. The BIST circuit responds to the test enable signal to test the logic circuit in a functional test. The BIST circuit transmits the test result data to an IC tester after the functional test. Throughput of the functional test can be improved by eliminating transmission of the test enable signal from the IC tester to the LSI.

4 Claims, 6 Drawing Sheets

LSI HAVING A BUILT-IN SELF-TEST CIRCUIT

BACKGROUND OF THE INVENTION (a) Field of the Invention

The present invention relates to a semiconductor large-scale integrated circuit (LSI) having a built-in self-test (BIST) circuit and, more particularly, to improvement of a BIST circuit installed in a LSI for testing the function of the logic circuit in the LSI.

(b) Description of the Related Art

IC tester is generally used In a test operation of a LSI. In a test operation of a high-speed LSI, the IC tester operates in a series of processing for the LSI, including transmitting a test pattern for operating the LSI, receiving resultant data from the LSI, comparing the resultant data against the expected data and judging pass/fail of the LSI. The series of the processing should be performed in accordance with the operational speed of the LSI under test, and thus the higher-speed LSI should be tested by the IC tester operating at a higher speed. However, since the higher-speed IC tester is expensive, it is desired to test the higher-speed LSI by using on ordinary IC tester operating at a lower speed and thus being less expensive.

It is usual that the high-speed LSI has a PLL circuit (PLL) for multiplying an external reference clock signal to generate an internal system clock signal for use within the LSI. In this case, the IC tester allows the higher-speed LSI to test itself by using the BIST circuit while operating the internal logic circuit with a higher-frequency system clock signal generated by the PLL. The BIST circuit receives the results of the self-test, stores compressed data for the test results, and transmits the test result data to the IC tester after the self-test is finished. This technique is described in Patent Publications JP-A-10-90362 and -11-30646, for example.

FIG. 1 shows signal flows between a conventional LSI and an IC tester during a self-test by the LSI. The LSI 20 includes a PLL circuit 13, a logic circuit 14 and a BIST circuit 15, and operates for self-test processing based on the test instruction supplied from the IC tester 12. The resultant data is transmitted from the BIST circuit 15 to the IC tester 12.

FIG. 2 shows a flowchart for the functional self-test conducted by the LSI 20 shown in FIG. 1. The IC tester 12 transmits a reference clock signal 101, and then a test enable signal 108 to the LSI 20. The LSI 20 starts for preparation of the functional self-test to generate the system clock signal after receiving the reference clock signal 101 at step S31, and starts for the functional self-test of the logic circuit 14 at step S32 after receiving the test enable signal 108. The BIST circuit 15 receives test result data 104 from the logic circuit 14, compresses the test result data 104, and stores the compressed data in step S33. After the functional self-test is finished by the BIST circuit 15, the LSI 20 transmits the test end signal 105 at step S34. The IC tester 12, after receiving the test end signal 105 from the LSI 20, transmits a data clock signal 106 to the LSI 20 in step S35. The LSI 20 transmits the test result data 107 in synchrony with the data clock signal 106 in step S36. The IC tester 12 then compares the test results in the test result data 107 against the expected data stored therein to judge pass/fail of the LSI.

There is a time interval (phase lock time) between the time instant at which the PLL circuit 13 starts for comparison of the phase between the reference clock signal and the system clock signal by using a feedback control and the time instant at which the phase lock is obtained after stabilization of the system clock signal. The IC tester 12 waits transmission of the test enable signal 108 to the LSI 20 during the phase lock time, which is different from LSI to LSI. The waiting time is set in the IC tester 12 in consideration of the general phase lock time in a variety of LSIs, especially adapting to a LSI having a long phase lock time.

Thus, in the test of the conventional LSI, the time interval between the steps S31 and S32 is too long for a high-performance LSI having a shorter phase lock time, and the IC tester waits for a longer time before transmission of the test enable signal to thereby lower the throughput of the functional self-test.

SUMMARY OF THE INVENTION

In view of the above, it is an object of the present invention to provide a LSI, which is capable of reducing the time interval between the steps transmitting reference clock signal and transmitting the test enable signal, by starting the functional self-test based on the phase lock time of the individual LSI under test to thereby improve the throughput of the functional self-test of the LSI.

The present invention provides a LSI including a PLL circuit for receiving a reference clock signal to generate a system clock signal, the PLL circuit comparing a phase of the system clock signal against a phase of the reference clock signal to detect a phase lock therebetween, a logic circuit for operating with the system clock signal for signal processing, and a built-in self-test (BIST) circuit for responding to a test enable signal to test the logic circuit in a functional self-test and receive test result data from the logic circuit, wherein the PLL circuit responds to a test instruction signal to generate the system clock signal and transmits the test enable signal to the BIST circuit upon detecting the phase lock under the presence of the test instruction signal.

In accordance with the LSI of the present invention, since the test enable signal is generated in the PLL circuit instead of the IC tester under the presence of the test instruction signal, the BIST circuit can starts for the functional self-test without a waiting time, whereby the throughput of the functional self-test can be improved.

The above and other objects, features and advantages of the present invention will be more apparent from the following description, referring to the accompanying drawings.

PREFERRED EMBODIMENTS OF THE INVENTION

Figure 1:
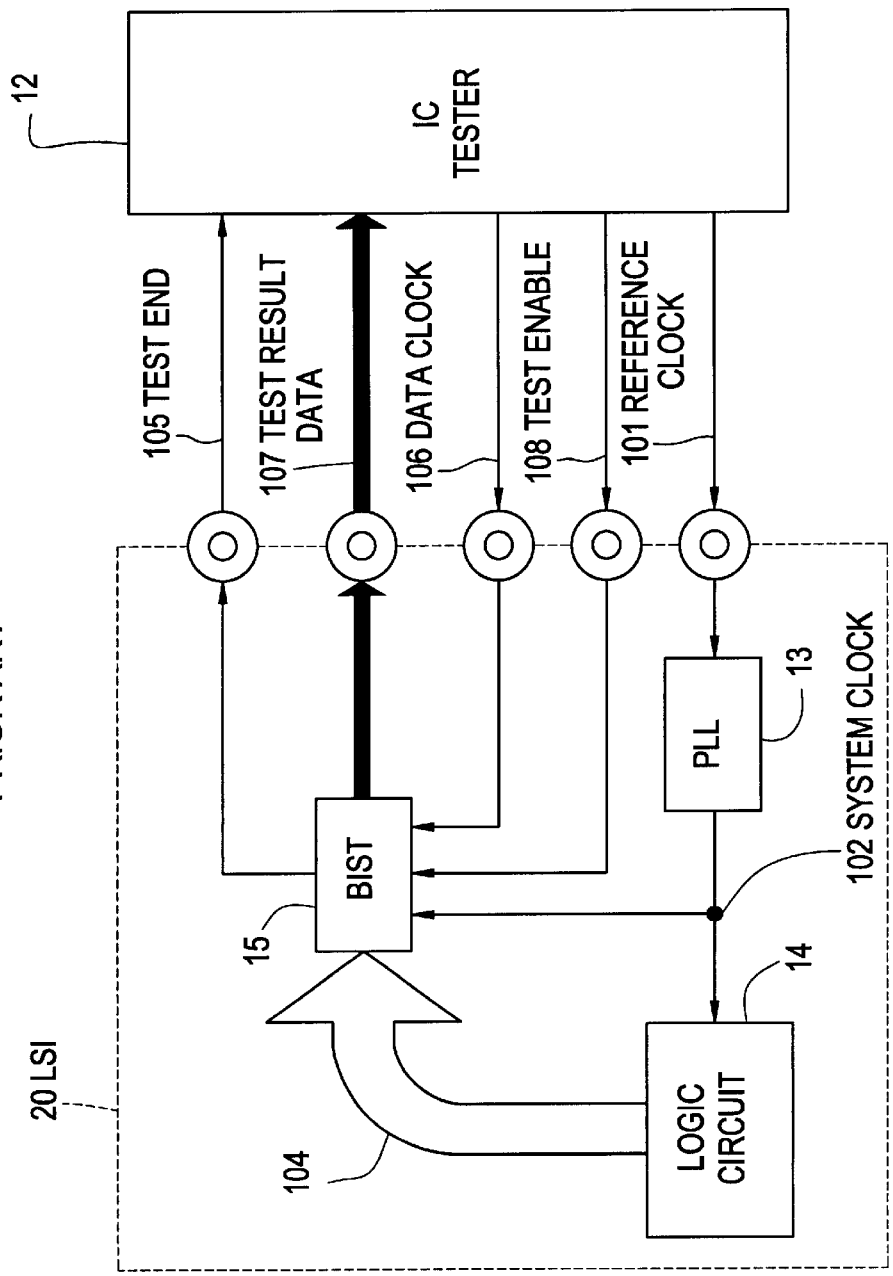
FIG. 1 is a block diagram of a conventional LSI, showing signal flows during a functional self-test for the LSI.
Figure 2:
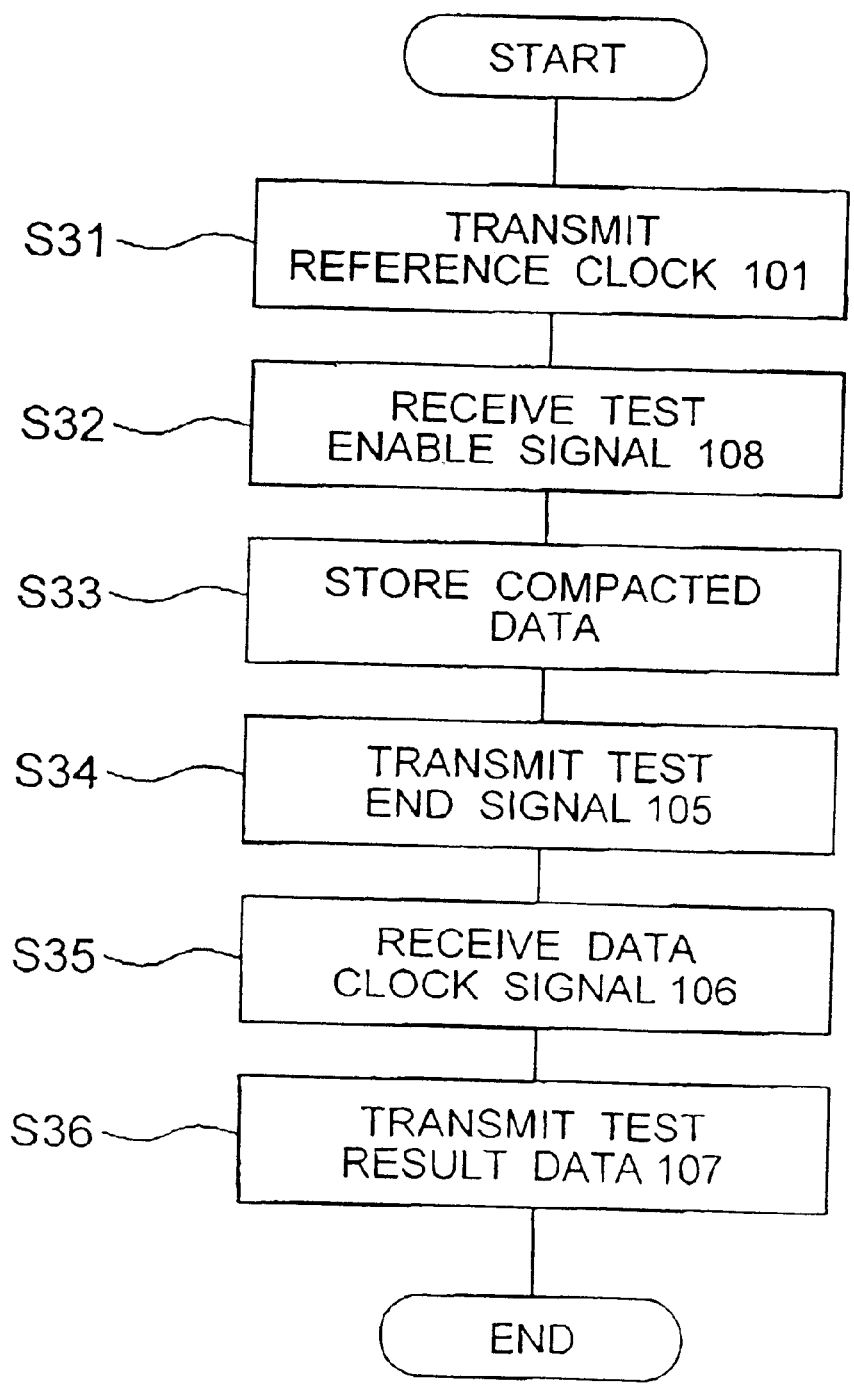
FIG. 2 is a flowchart of the operation in the LSI of FIG. 1.

Now, the present invention is more specifically described with reference to accompanying drawings, wherein similar constituent elements are designated by similar reference numerals throughout the drawings.

Figure 3:
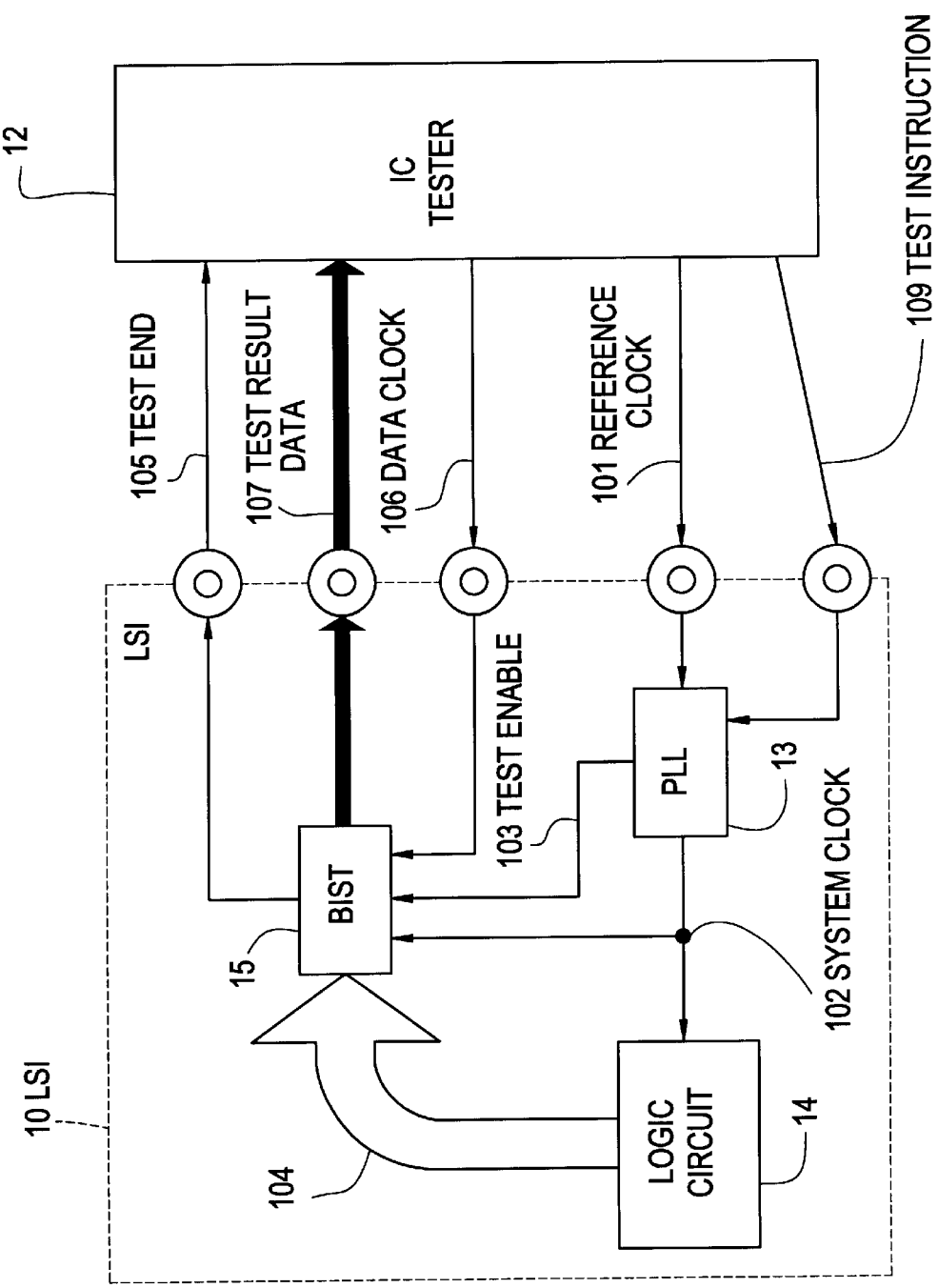
FIG. 3 is a block diagram of a LSI according to a first embodiment of the present invention, showing signal flows during a functional self-test for the LSI.

Referring to FIG. 3, a LSI, generally designated by numeral 10, according to a first embodiment of the present invention includes a logic circuit 14, a PLL circuit 13 and a BIST circuit, and is subjected to a functional self-test based on the instruction from the IC tester 12.

The PLL circuit 13 receives a reference clock signal 101 from the IC tester 12, generates an internal system clock signal 101 therein by multiplication of the frequency of the reference clock signal 101, and compares the phase of the system clock signal 102 against the phase of the reference clock signal 101 to generate a phase lock signal after the coincidence of the phase therebetween. The system clock signal 102 is delivered to the logic circuit 14 and the BIST circuit 15.

The logic circuit 14 has a design function, operates with the system clock signal 102 for signal processing, and delivers output signal therefrom during a normal operation as well as a functional test operation thereof.

The BIST circuit 15 includes a test pattern generator for testing the function of the logic circuit 14, a compressor/decompressor for compressing/decompressing the test result data 104 received from the logic circuit 14, and an internal register for storing the compressed test result data. The BIST circuit 15 operates with the system clock signal 102, receives the test result data 104 from the logic circuit 14, compresses the test result data 104, and stores the compressed data for the test result data in the internal register.

The LSI 10 starts for a functional self-test operation after receiving the reference clock signal 101 and a test instruction signal (109), and transmits the test result data 107 to the IC tester 12 after the functional test of the logic circuit 14 is finished using the system clock signal 102.

Figure 4:
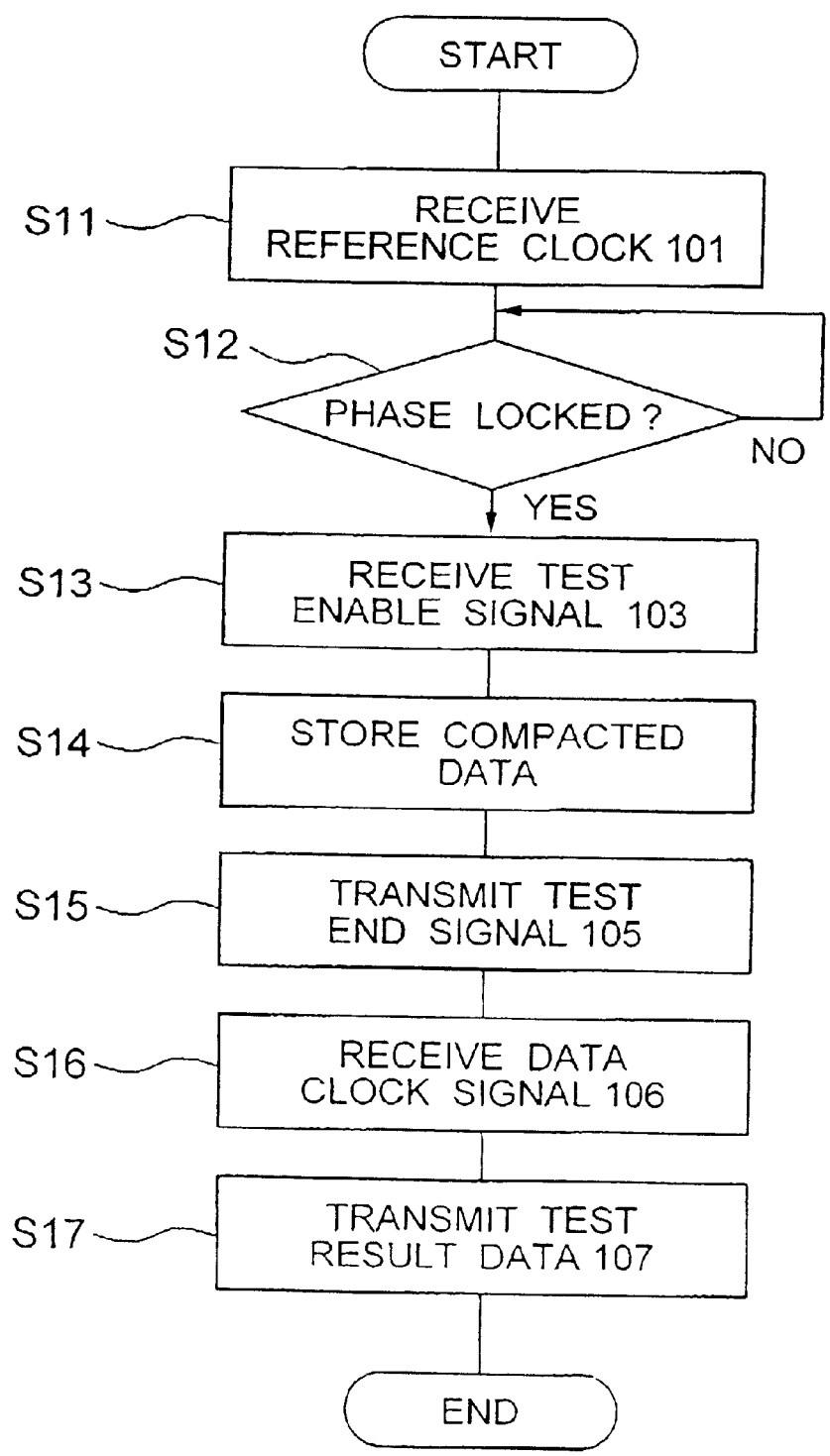
FIG. 4 is a flowchart of the operation in the LSI of FIG. 3.

Referring to FIG. 4, the reference clock signal 101 is delivered from the IC tester 12 together with the self-test instruction signal in step S11. The PLL circuit 13 starts for oscillation upon receiving the reference clock signal 101 to generate the system clock signal 102 from the reference clock signal 101. The PLL circuit 13 judges whether or not a phase lock is achieved between the reference clock signal 101 and the system clock signal 102 in step S12, and delivers the system clock signal 102 to the logic circuit 14 and the BIST 15 circuit after detecting the phase lock. At the same time, the PLL circuit 13 delivers a test enable signal 103 to the BIST circuit 15.

The BIST circuit 15 starts for a self-test operation, upon receiving the test enable signal 103, by delivering test patterns to the logic circuit 14 in step S13. The BIST circuit 15 receives output test result data 104 for respective test patterns in synchrony with the system clock signal 102 from the logic circuit 14 which responds to the test patterns. The BIST circuit 15 compresses the received test result data 104 and stores compressed data of the test result data in the internal register in step S14. After a series of self-tests are finished for the logic circuit 14, the BIST circuit 15 delivers a test end signal 105 to the IC tester 12 in step 515.

The IC tester 12 responds to the test end signal 105 in step S16 to deliver a data clock signal 106 to the LSI 20, which then delivers the test result data 107 stored in the internal register of the BIST circuit 15 to the IC tester 12 after decompressing thereof in step S17. The test result data 107 is delivered to the IC tester 12 from the BIST circuit 15 by a serial data transmission in step S17.

The IC tester 12 compares test results in the received test result data 107 against the expected results, and judges pass/fail of the LSI 10, whereby the functional self-test is finished.

In the above embodiment, since the functional self-test is started in the BIST circuit 15 based on the phase lock signal generated in the LSI under test, the waiting time is not encountered during the IC test.

Figure 5:
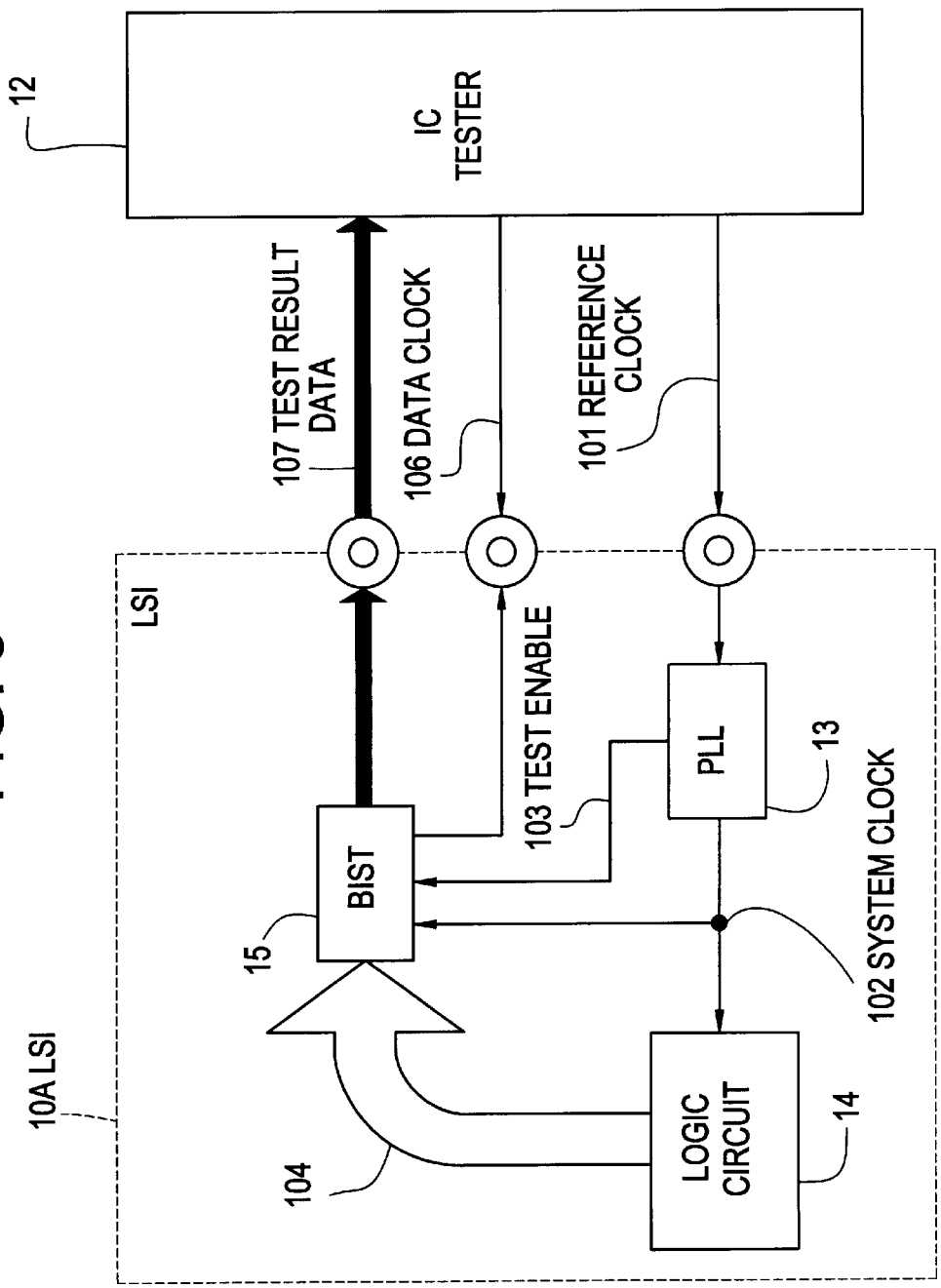
FIG. 5 is a block diagram of a LSI according to a second embodiment of the present invention, showing signal flows during a functional self-test for the LSI.

Referring to FIG. 5, an IC test for a LSI according to a second embodiment of the present invention is different from the IC test shown in FIG. 3 in that the LSI 10A transmits the test result data 107 and the data clock signal 106 to the IC tester 12 without transmitting the test end signal after the self-test is finished by the BIST circuit 15.

Figure 6:
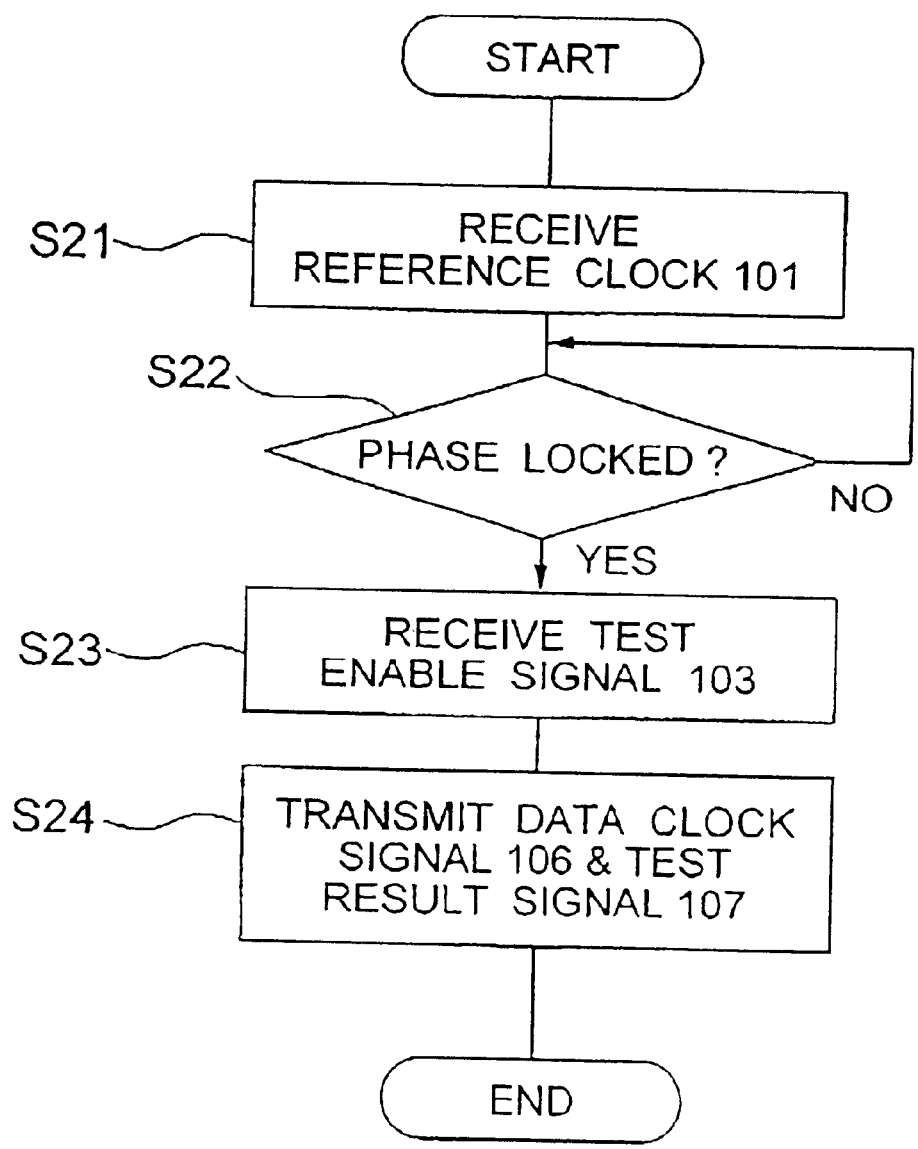
FIG. 6 is a flowchart of the operation in the LSI of FIG. 5.

Referring to FIG. 6, steps S21 to S24 in the second embodiment are similar to steps of S11 to S14, respectively, in the first embodiment. In the present embodiment, the BIST circuit 15 transmits the data clock signal 106 and the test result signal 107 to the IC tester 12 in step S25 by a serial data transmission.

In the present embodiment, since the IC tester need not transmit the data clock signal 106, the circuit structure of the IC tester 12 can be simplified and the time length for the self-test can be also reduced.

Since the above embodiments are described only for examples, the present invention is not limited to the above embodiments and various modifications or alterations can be easily made therefrom by those skilled in the art without departing from the scope of the present invention.

What is claimed is:

1. A large-scale integrated circuit (LSI) comprising:

a phase-locked-loop (PLL) circuit for receiving a reference clock signal to generate a system clock signal, said PLL circuit comparing a phase of said system clock signal against a phase of said reference clock signal to detect a phase lock therebetween;

a logic circuit for operating with said system clock signal for signal processing; and a built-in self-test (BIST) circuit for responding to a test enable signal to test the logic circuit in a functional self-test and receive test result data from said logic circuit;

wherein said PLL circuit responds to a test instruction signal to generate said system clock signal and transmits said test enable signal to said BIST circuit upon detecting said phase lock under the presence of said test instruction signal.

2. The LSI as defined in claim 1, wherein said BIST circuit transmits a test end signal after said functional self-test is finished.

3. The LSI as defined in claim 2, wherein said BIST circuit, after transmitting said test end signal, transmits said test result data in synchrony with a data clock signal supplied from outside said LSI.

4. The LSI as defined in claim 1, wherein said BIST circuit transmits said test result in synchrony with a data clock signal after said functional self-test is finished.

* * * * *